United States Patent
Bartley et al.

(10) Patent No.: US 8,140,297 B2
(45) Date of Patent: Mar. 20, 2012

(54) THREE DIMENSIONAL CHIP FABRICATION

(75) Inventors: Gerald K. Bartley, Rochester, MN (US); Charles L. Johnson, Rochester, MN (US); Mark M. Thornton, Rochester, MN (US); Patrick R. Varekamp, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 384 days.

(21) Appl. No.: 12/354,958

(22) Filed: Jan. 16, 2009

(65) Prior Publication Data

US 2010/0185410 A1 Jul. 22, 2010

(51) Int. Cl.
- G06F 11/22 (2006.01)
- G06F 11/00 (2006.01)
- G06F 11/30 (2006.01)
- G01R 31/26 (2006.01)
- G01R 31/00 (2006.01)
- G01R 31/02 (2006.01)
- G01D 21/00 (2006.01)

(52) U.S. Cl. ...... 702/182; 73/865.8; 73/865.9; 702/108; 716/106; 716/136

(58) Field of Classification Search ........ 73/432.1, 73/865.8, 865.9; 324/500, 537, 762.01, 762.03, 324/762.05, 762.06, 763.01, 763.02; 438/14; 702/1, 108, 117, 120, 127, 182, 183, 187, 702/189; 716/50, 100, 106, 110, 111, 118, 716/136

See application file for complete search history.

(56) References Cited

U.S. PATENT DOCUMENTS

| | | | | |
|---|---|---|---|---|
| 4,612,083 | A * | 9/1986 | Yasumoto et al. | 438/59 |
| 4,939,568 | A * | 7/1990 | Kato et al. | 257/686 |
| 5,591,678 | A * | 1/1997 | Bendik et al. | 438/459 |
| 6,014,313 | A * | 1/2000 | Hesselbom | 361/704 |
| 6,646,735 | B2 * | 11/2003 | Fukazawa et al. | 356/237.4 |
| 7,354,798 | B2 * | 4/2008 | Pogge et al. | 438/109 |
| 7,521,950 | B2 * | 4/2009 | Bernstein et al. | 324/750.3 |
| 7,913,202 | B2 * | 3/2011 | Bernstein et al. | 716/104 |
| 7,924,458 | B2 * | 4/2011 | Taniuchi et al. | 358/1.8 |
| 8,046,727 | B2 * | 10/2011 | Solomon | 716/116 |
| 2002/0093647 | A1 * | 7/2002 | Fukazawa et al. | 356/237.1 |
| 2006/0121690 | A1 * | 6/2006 | Pogge et al. | 438/455 |
| 2007/0081410 | A1 * | 4/2007 | Bernstein et al. | 365/230.03 |
| 2007/0146734 | A1 * | 6/2007 | Taniuchi et al. | 358/1.1 |
| 2008/0068039 | A1 * | 3/2008 | Bernstein et al. | 326/16 |
| 2009/0070727 | A1 * | 3/2009 | Solomon | 716/16 |
| 2009/0070728 | A1 * | 3/2009 | Solomon | 716/16 |

* cited by examiner

*Primary Examiner* — Edward Cosimano
(74) *Attorney, Agent, or Firm* — Jim Boice

(57) ABSTRACT

A three-dimensional (3D) chip is fabricated from components that have been cut out of a two-dimensional (2D) chip. The components from the 2D chip are layered and coupled to create the layers of the 3D chip. By testing the 2D chip first, the layers of the 3D chip have been pre-tested, thus reducing testing and production costs.

20 Claims, 9 Drawing Sheets

THREE DIMENSIONAL CHIP FABRICATION

BACKGROUND

The present disclosure relates to the field of semiconductor chip fabrication. Still more particularly, the present disclosure relates to fabricating three-dimensional (3D) chips.

Early semiconductor logic chips, such as microprocessors, were fabricated in two dimensions (2D). That is, a single-layer chip would contain memory, execution units, busses, input/output (I/O) logic, and etc. all in a same plane. Recently developed logic chips, however, use a three-dimensional (3D) architecture, in which different components are physically on different chips. These different components typically interact via hard wiring, which causes timing and other signal problems. Furthermore, the 3D chip requires a different tapeout (final hardware design) for each layer. Thus, for a four layer 3D chip, four separate tapeouts are required. Validating a tapeout release and creating artwork (for photolithography used in the manufacturing of the chip) runs in the $1M-$2M range for 45 nm and newer technologies, thus resulting in a $4M-$8M tapeout expense for a four-layer 3D chip.

SUMMARY

A three-dimensional (3D) chip is fabricated from components that have been cut out of a two-dimensional (2D) chip to create the layers of the 3D chip. By testing the 2D chip first, the layers of the 3D chip have been pre-tested, thus reducing testing and production costs.

The above, as well as additional purposes, features, and advantages of the present invention will become apparent in the following detailed written description.

BRIEF DESCRIPTION OF THE SEVERAL VIEWS THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION

Figure 1:
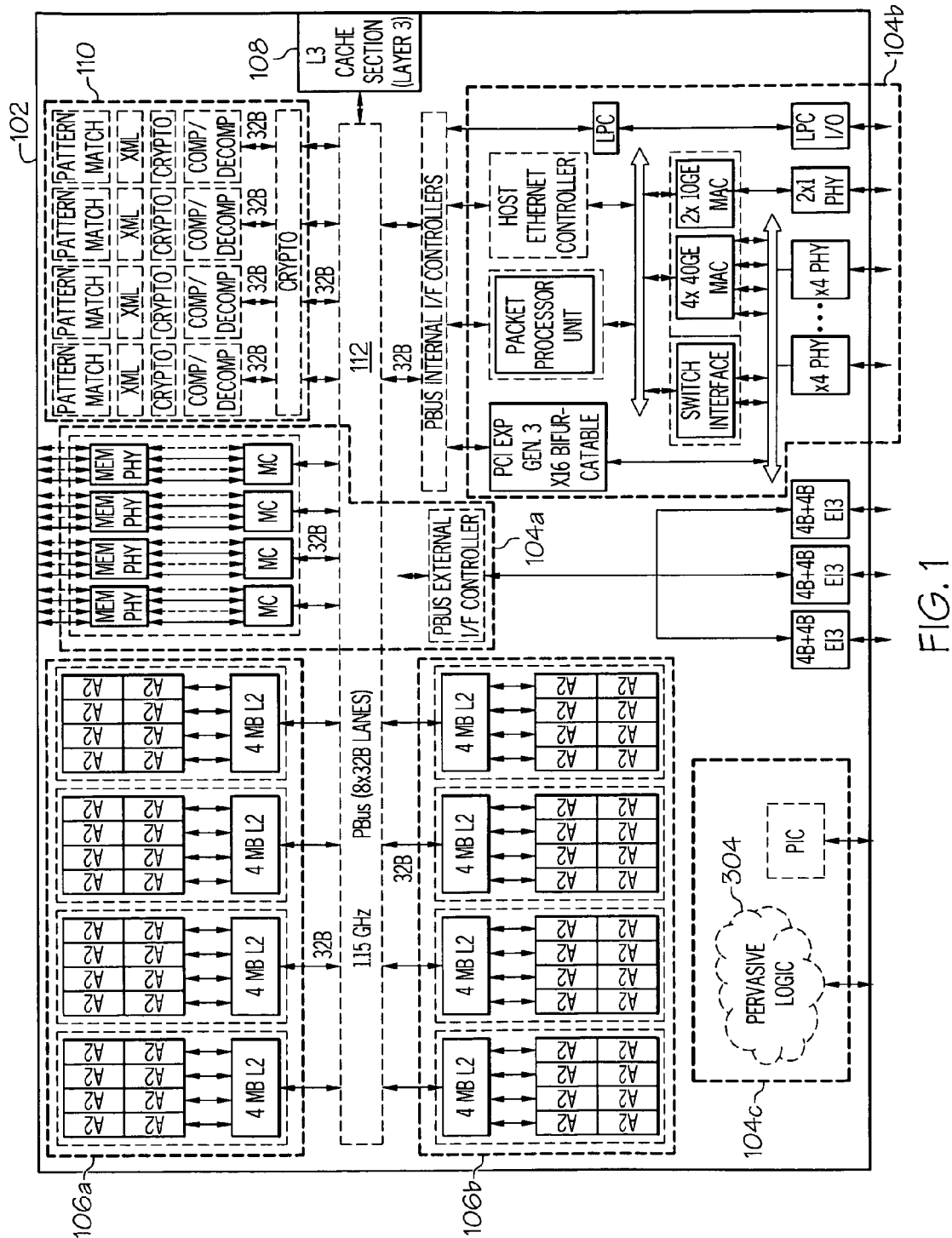
FIG. 1 depicts an exemplary two-dimensional (2D) computer chip that is designed to be physically sectioned apart to create components for a three-dimensional (3D) stacked computer chip.

With reference now to the figures, and in particular to FIG. 1, a novel two-dimensional (2D) planar processor chip 102 is depicted. As depicted, 2D planar processor chip 102 is fully contained on a single layer of semiconductor material and connectors. As will be discussed in further detail below, part of the novelty of 2D planar processor chip 102 is that it has been specifically designed to be in a modular format that includes Input/Output (I/O) sections 104a, 104b and 104c, computer sections 106a and 106b, L3 cache section 108, and an accelerator section 110 which can be physically cut apart without losing section functionality. Thus, after being physically cut apart, I/O sections 104a, 104b and 104c, computer sections 106a and 106b, L3 cache section 108, and accelerator section 110 are designed to be the logic that will be used in respective Layers 1-4 of a three-dimensional (3D) processor chip, which will be discussed in further detail below.

Note the following features of I/O sections 104a, 104b and 104c, computer sections 106a and 106b, L3 cache section 108, and accelerator section 110. First, all of these sections are functionally interactive. That is, each of these sections are related such that their functionality and parameters, including but not limited to timing conditions, clock speeds, communication and packet protocols, etc. must be compatible. By communicating with one another via a same peripheral bus (PBus) 112, these sections form a fully functional processor chip. Second, each of these sections is capable of being tested either together or alone, preferably via a scan-chain (not shown) and test point logic (also not shown) that is within and integral to each of the sections. Third, each of these sections is taped out in a manner that permits each of the sections to be physically cut out of the 2D planar processor chip 102 in a manner that preserves connectors between each of the sections and the PBus 112.

Figure 2:
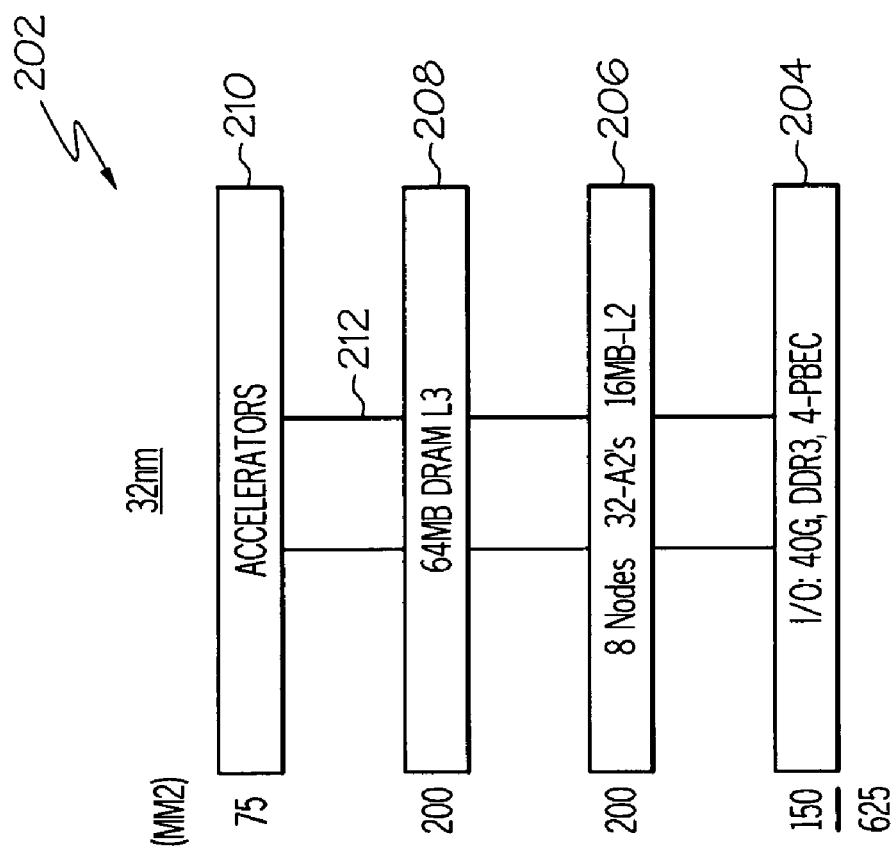
FIG. 2 illustrates an exemplary 3D computer chip that has been constructed from components cut out of the 2D chip depicted in FIG. 1.

Referring now to FIG. 2, a three-dimensional (3D) stacked processor chip 202, which is constructed of multiple functional sections (i.e., I/O sections 104a, 104b and 104c, computer sections 106a and 106b, L3 cache section 108, and accelerator section 110) that have been cut out of the 2D planar processor chip 102 shown in FIG. 1. As depicted, I/O sections 104a, 104b and 104c form layer 1 (204), computer sections 106a and 106b form layer 2 (206), L3 cache section 108 forms layer 3 (208), and accelerator section 110 forms layer 4 (210) of the 3D stacked processor chip 202. All of these layers are coupled by a layer-layer bus 212, which interfaces with a periphery bus (PBus) on each of the layers. Note that these Pbuses (not shown in FIG. 2) are constructed to have functionally equivalent connectors and operational parameters as the PBus 112 used by the 2D planar processor chip 102 depicted in FIG. 1.

Figure 3:
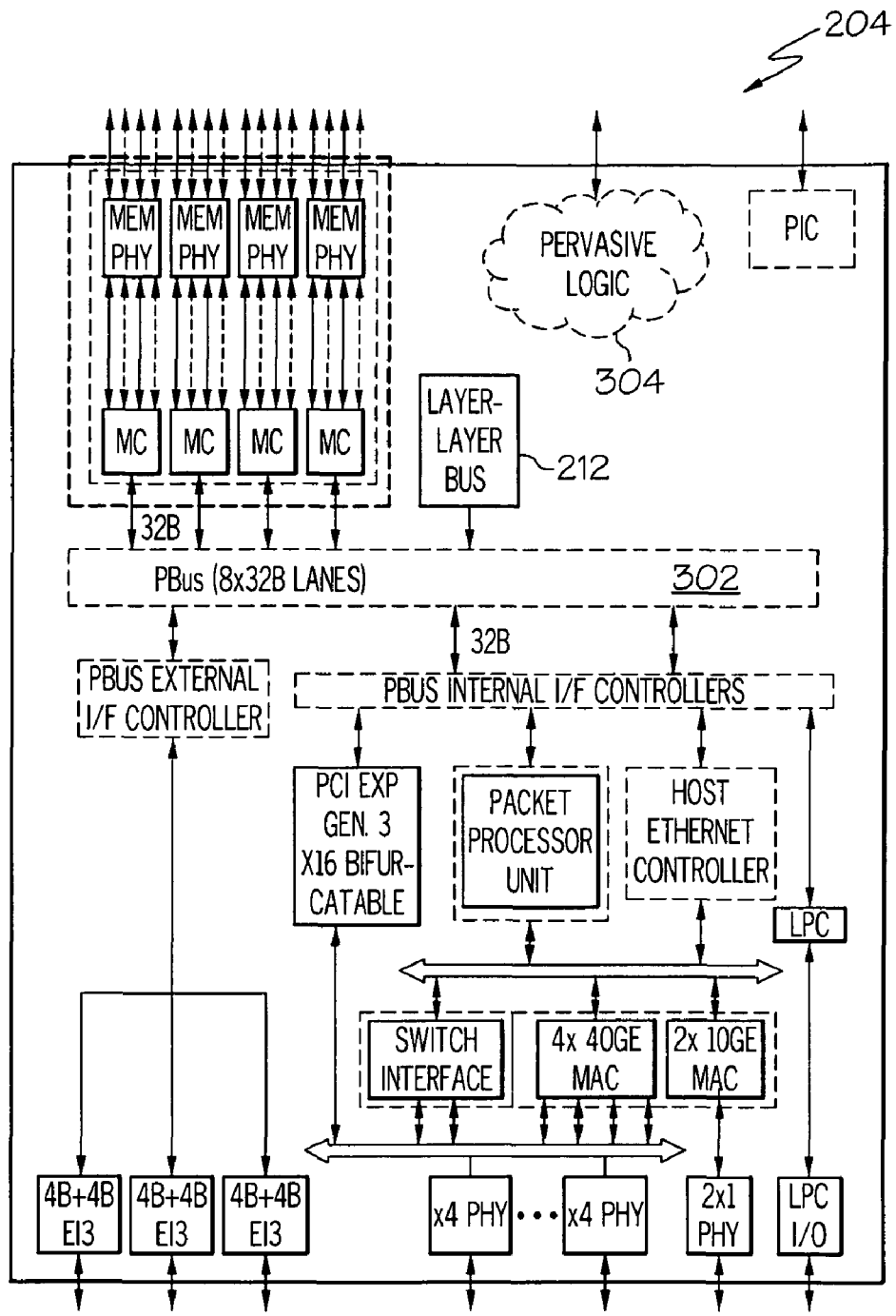
FIG. 3 illustrates additional detail of the Input/Output (I/O) layer of the 3D computer chip illustrated in FIG. 2.

With reference now to FIG. 3, additional detail is presented for I/O layer 204. I/O layer 204 includes multiple depicted interfaces, memory, and controllers necessary for 3D stacked processor chip 202 to communicate with other resources. Significant to certain aspects of the present invention, however, is PBus 302 and pervasive logic 304. As stated above, PBus 302 is a PBus that is functionally and operationally equivalent to the PBus 112 depicted in FIG. 1. In a preferred embodiment, PBus 112 was constructed in a modular manner. That is, each of the multiple functional sections (I/O sections 104a, 104b and 104c, computer sections 106a and 106b, L3 cache section 108, and accelerator section 110) depicted in FIG. 1 are coupled to a different modular section of PBus 112. These modular sections of PBus 112 are able to communicate with each other via interconnection logics (not shown) when in the 2D planar processor chip 102 depicted in FIG. 1.

However, when 2D planar processor chip 102 is cut up into the multiple functional sections, each of the functional sections remains functionally coupled to its own modular section of PBus 112. Thus, each layer has a PBus that can be coupled to the layer-layer bus 212, which traverses through and is coupled to each of the layers. In a preferred embodiment, the layer-layer bus 212 is also part of the 2D planar processor chip 102. While part of the 2D planar processor chip 102, the layer-layer bus 212 is in different sections that correspond to each of the multiple functional sections. Thus, when the layers are being stacked to created the 3D stacked processor chip 202, only these modular components of the layer-layer bus 212 need to be attached. Alternatively, a single layer-layer bus 212 can first be introduced when constructing the 3D stacked processor chip 202, such that the layer-layer bus 212 is inserted into a hole within each of the layers, and the layer-layer bus 212 is then connected to the PBus on each layer.

Focusing again on FIG. 3, the pervasive logic 304 may include logic for conducting a Built In Self Test (BIST), which tests the entire assembled 3D stacked processor chip 202 and/or specific layers and/or one or more components found on a specific layer. This BIST may be performed using a scan-chain logic that is inherent and within one or more of the components on the different layers/sections. Note also that pervasive logic 304 is shown in the 2D planar processor chip 102 shown in FIG. 1, and is capable in that environment of testing components and/or sections of the 2D planar processor chip 102.

Figure 4:
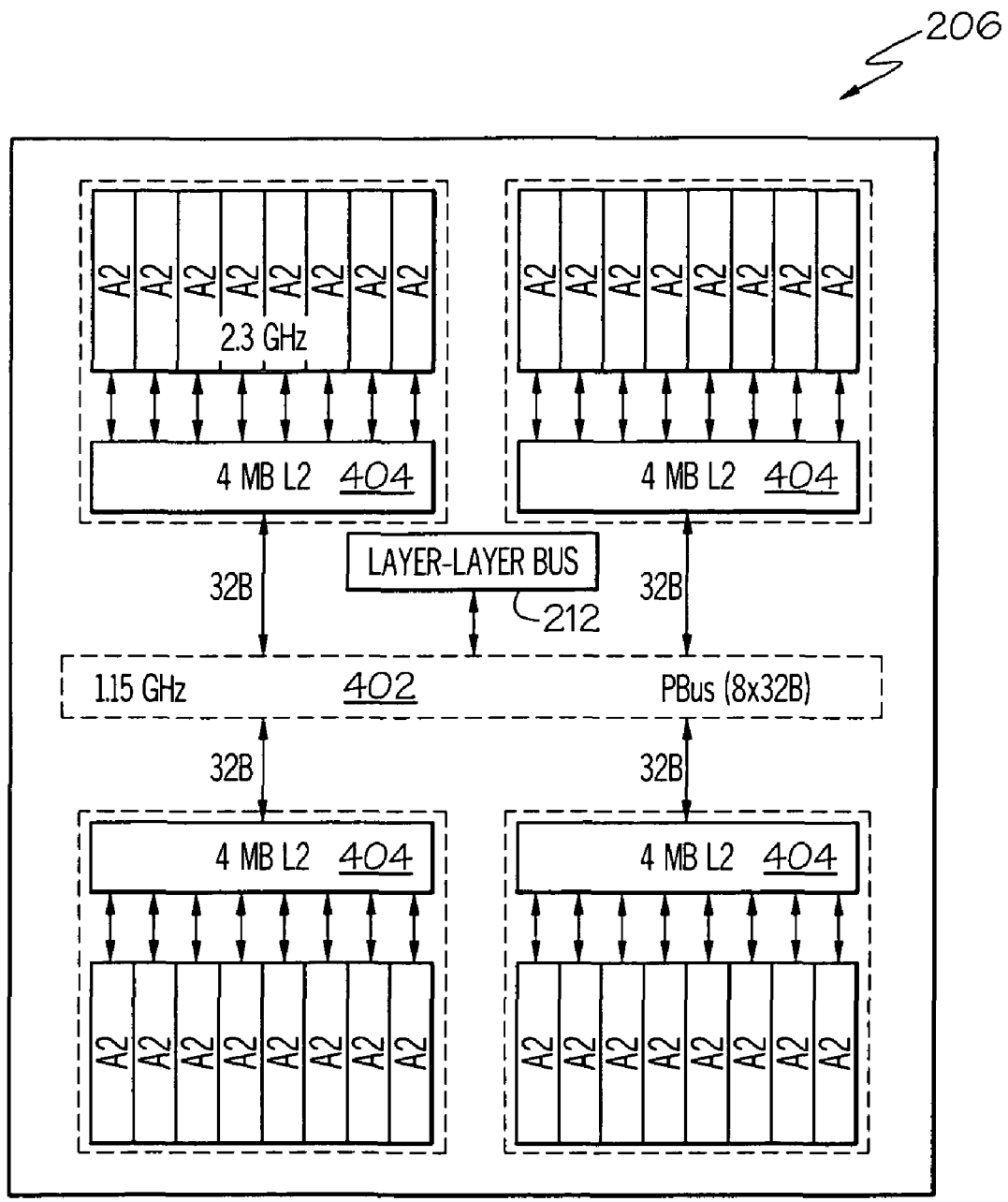
FIG. 4 depicts additional detail of the compute layer of the 3D computer chip illustrated in FIG. 2.
Figure 5:
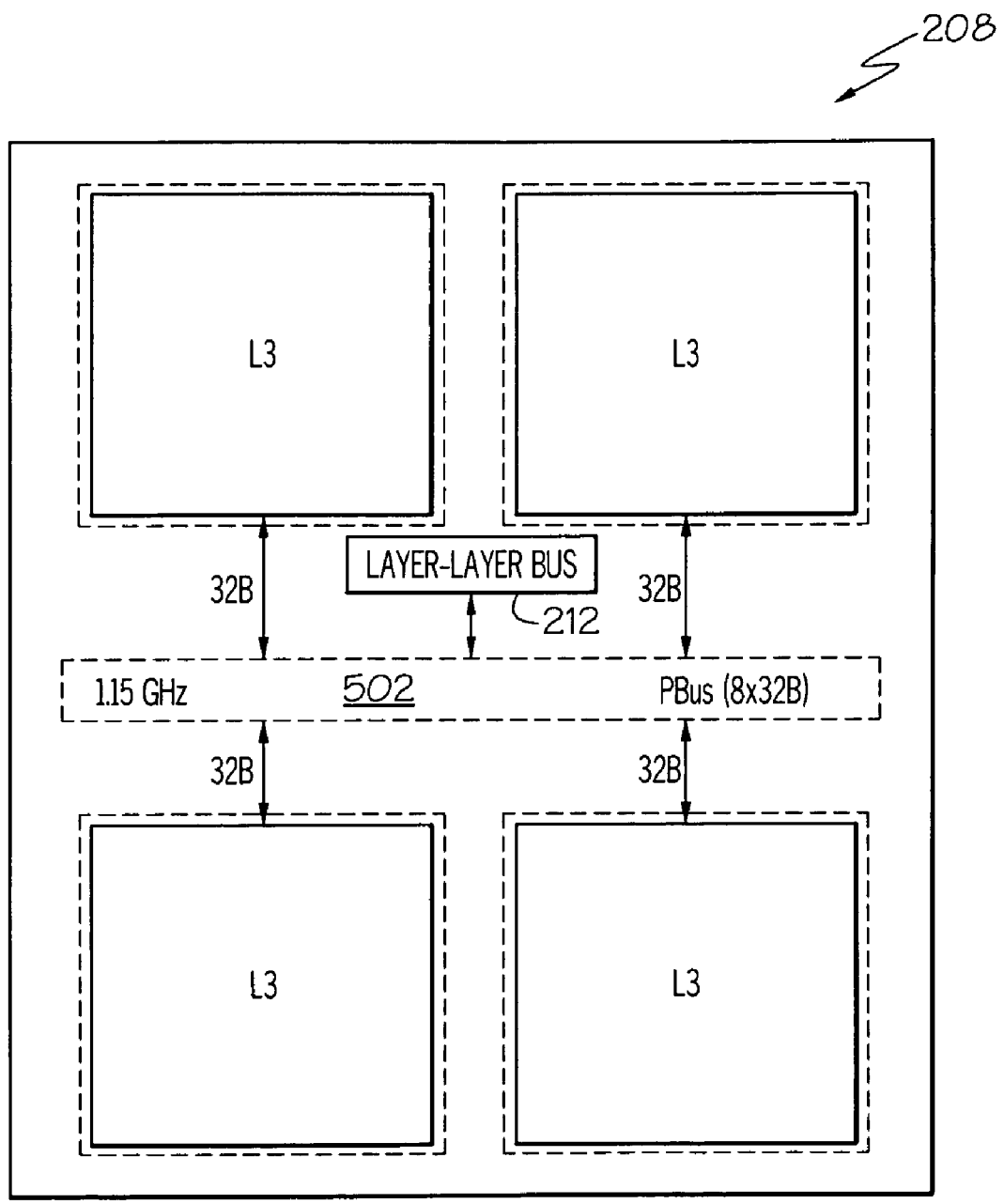
FIG. 5 illustrates additional detail of the cache layer of the 3D computer chip illustrated in FIG. 2.

Referring now to FIG. 4, additional detail is presented for compute layer 206 of the 3D stacked processor chip 202. As with I/O layer 204 discussed above, compute layer 206 also has a PBus 402, which is functionally equivalent to, and may be carved out of, the PBus 112 shown in FIG. 1. As in I/O layer 204, compute layer 206 has a PBus 402 that is physically and functionally coupled to the layer-layer bus 212, thus allowing data, instruction and control signal communication with other layers in the 3D stacked processor chip 202. Note that compute layer 206 has multiple cores (A2) that communicate with the PBus 402 via dedicated L2 cache 404. This L2 cache 404 is able to communicate with lower level L3 cache, such as that shown in FIG. 5 for L3 cache layer 208, via the layer-layer bus 212 and a PBus 502 that is part of L3 cache layer 208.

Figure 6:
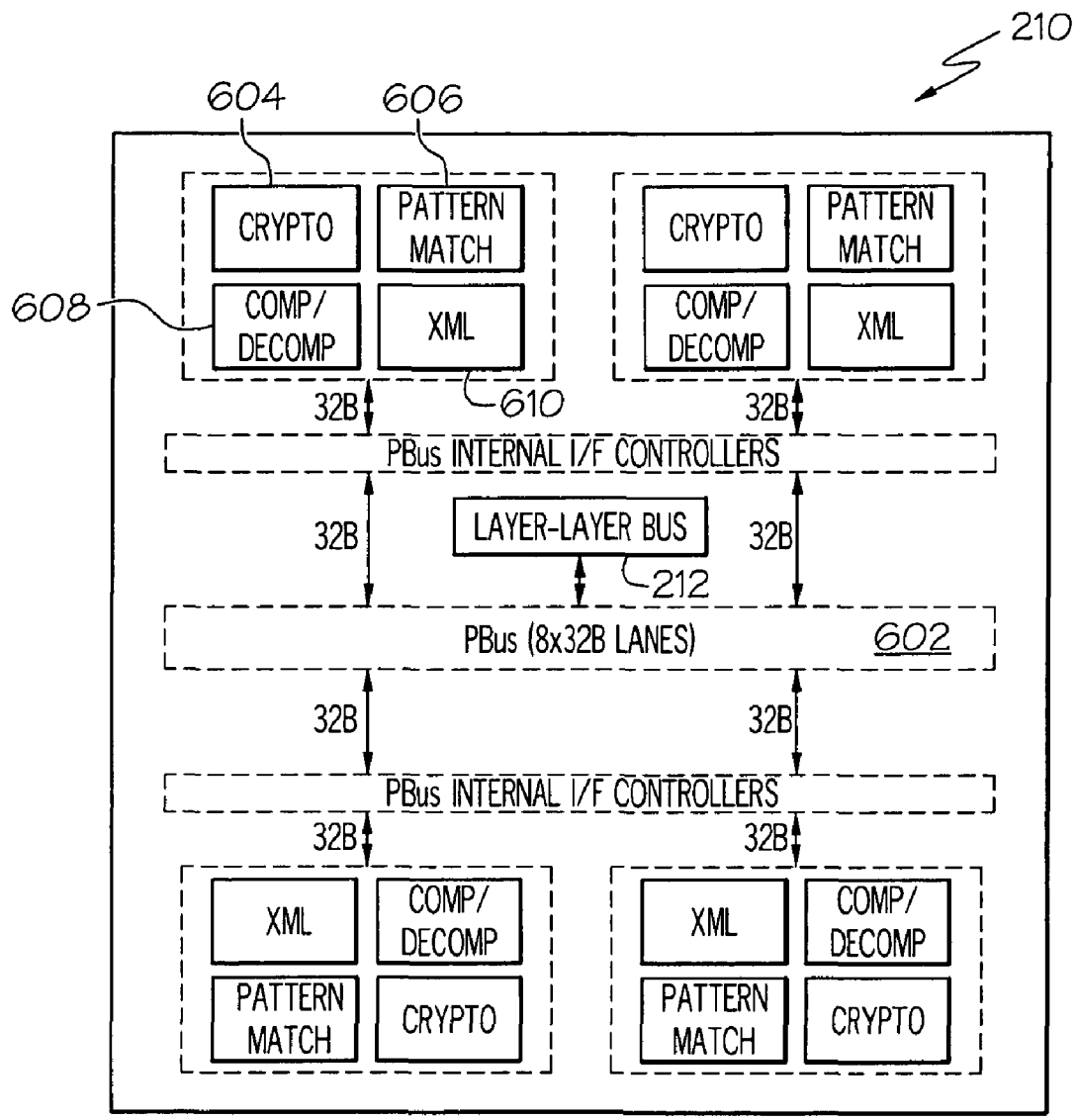
FIG. 6 depicts additional detail of the accelerator layer of the 3D computer chip illustrated in FIG. 2.

With reference now to FIG. 6, additional detail for accelerator layer 210 is presented. Accelerator layer 210 includes specialized hardware designed to improve overall performance of the 3D stacked processor chip 202. As with other layers, accelerator layer 210 has a PBus 602 that communicates with other layers via the layer-layer bus 212. In the embodiment shown, accelerator layer 210 includes a cryptology logic 604 for encrypting data being transmitted from the 3D stacked processor chip, a pattern matching logic 606 for identifying types of data being received by the 3D stacked processor chip 202, a compression/decompression logic 608 for compressing and decompressing data being sent from and to the 3D stacked processor chip, and an extensible markup language (XML) logic 610 for executing XML command-based messages that are received by the 3D stacked processor chip.

Figure 7:
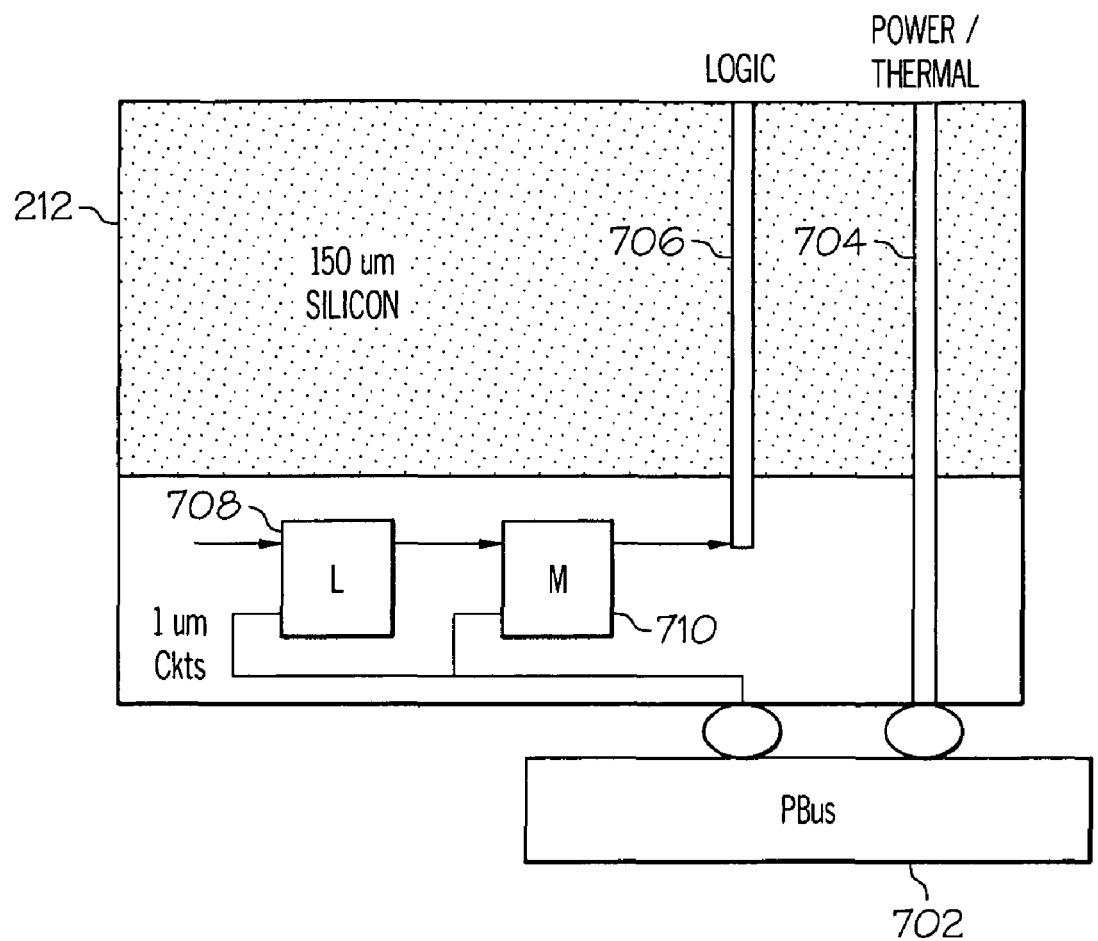
FIG. 7 depicts detail of thru vias in a layer-layer of the 3D computer chip illustrated in FIG. 2.

With reference now to FIG. 7, additional detail of a portion of layer-layer bus 212, as interfacing with a PBus 702 (e.g., PBus 302, 402, 502, or 602 discussed above) is presented. Note that layer-layer bus 212 includes a power via 704 for supplying power to a layer. Furthermore, layer-layer bus 212 includes a logic via 706, which provides a conduit for data/instructions/signals to a particular layer through the use of control logic 708 and a multiplexer 710. Control logic 708 determines if a specific data/instruction/signal is destined for the layer that has and is using this particular PBus 702. If so, then that data/instruction/signal is sent to that PBus 702. If the control logic 708 determines that the data/instruction/signal is destined for another layer, then that data/instruction/signal is forwarded on through the layer-layer bus 212 to a next layer.

Figure 8:
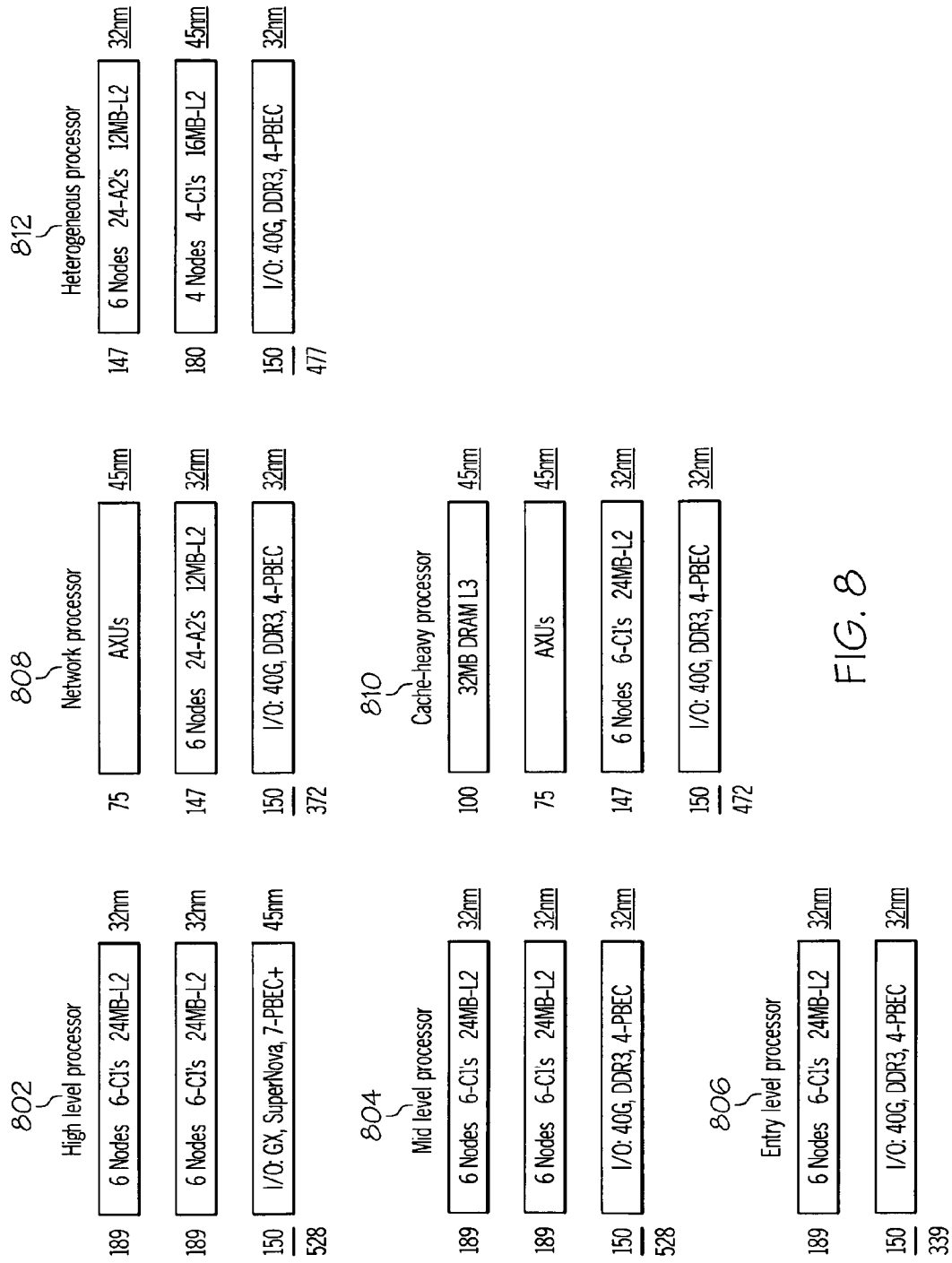
FIG. 8 illustrates an overview of different configurations available for constructing the 3D computer chip illustrated in FIG. 2.

With reference now to FIG. 8, an overview of different configurations available for constructing the 3D stacked processor chip 202 is presented. For example, the 3D stacked processor chip 202 can have a large number of processors and enhanced I/O features (high level processor 802), fewer I/O features (mid level processor 804), or minimal features (entry level processor 806). Similarly, the 3D stacked processor chip 202 can be configured for networking (network processor 808), cache intensive applications (cache-heavy processor 810), or for special configurations, such as that shown for heterogeneous processor 812. The modular construction described above allows virtually any configuration desired by the customer.

Figure 9:
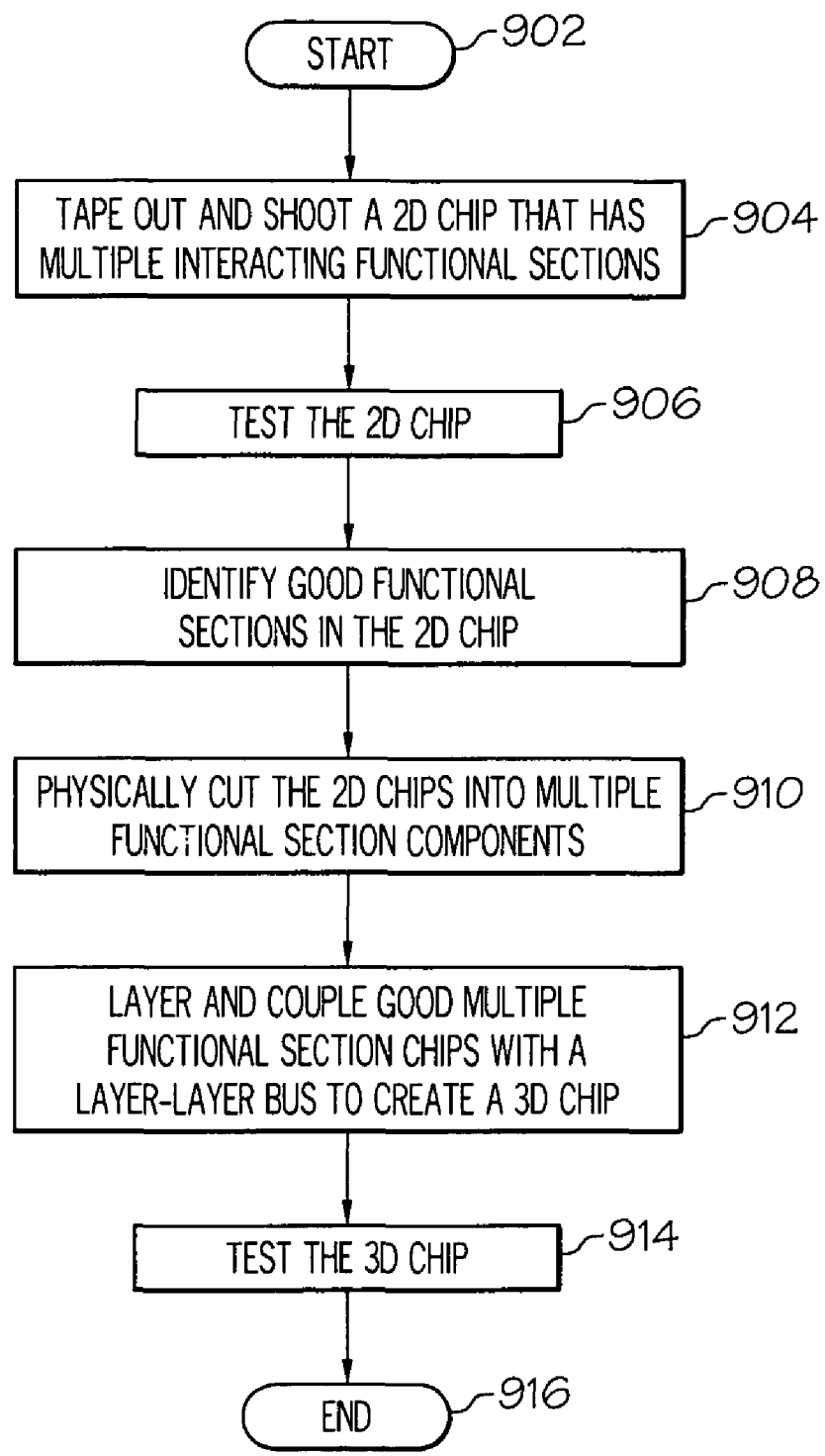
FIG. 9 is a high-level flow chart of exemplary steps taken to construct a 3D computer chip from components in a 2D computer chip.

Referring now to FIG. 9, a high-level flow chart of exemplary steps taken to construct a 3D processor chip from a 2D processor chip is presented. After initiator block 902, a 2D chip is taped out and shot (i.e., pathways, logic and circuits are laid out using photolithograph, etching, masking, etc.), as described in block 904. The 2D processor chip is then tested (block 906), either by testing the entire 2D processor chip as a single entity that will pass or fail together or by testing individual components within the 2D processor chip. Thus, if component compatibility tolerances are so tight that only components that are tested together can be trusted as having truly passed (due to their inter-dependency), then the entire chip (or at least components that have tight compatibility criteria) are tested together. If, however, the individual components are more tolerant of being used later with other components that have higher tolerances for interaction, or that not have passed all parameters of a test, then each component may be independently tested in the 2D processor chip.

As described in block 908, the 2D processor chip components are then identified, according to the testing described in block 906, as being "good" (having passed the test in accordance with pre-specified criteria) or "bad" (having failed one or more tests). The good components are then physically cut out of the 2D planar processor chip (block 910) and are vertically reassembled (block 912) to create the 3D stacked processor chip described above. The 3D processor chip is then tested (block 914) before shipment to a customer (terminator block 916).

Thus, in the process described herein, the entire functionality components of a 2D processor is partitioned into multiple sub-function layers, such as an I/O layer, a compute layer, an accelerator layer, a cache layer, etc. By utilizing a standardized layer-layer interface structure (i.e., the layer-layer bus and connections to the PBuses as described above), the 3D processor chip can be constructed. Note again that the layer-layer interface structure has physical, logical, and electrical definitions. Basic elements in the layer-layer interface structure include signal and Vdd/Gnd connections. Note also that the layer-layer interface structure is extendable across N layers (where "N" is an integer").

As described above, the 3D processor chip has "thru" layers (that allow signals and power to pass through to other layers), "source" layers (that provide original signals and power sources), and "terminating" layers (in which the signals and power terminate).

While the present invention provides a novel and useful process for constructing economic and highly scalable 3D processor chips, an additional benefit is that no additional interconnect latency is added with the presently disclosed method, process and structure. Rather, interconnect latency is less than in a traditional 2D silicon or multi-chip module implementation.

Note that while the figures show the layer-layer bus as having different sizes/scales, for optimal scalability and modularity in constructing 3D processor chips, this layer-layer structure should have a consistent cross-sectional dimension that is in physically identical locations on all layers. This permits the "stacking" of independent layers with "automatic" signal and power connections.

Note that the present invention also minimizes the number of tapeouts required to develop and construct a 3D chip. That is, one significant drawback of prior art 3D chip construction versus the construction of a 2D chip is that the prior art 3D chip construction required multiple tapeout releases. Thus, for a four layer 3D chip, four separate tapeouts would be required versus a single tapeout for a 2D chip. The present invention permits the construction of a true 3D chip with only one tapeout (during the construction of the precursor 2D chip). Specifically, since it is possible with a 700 square millimeter reticle to fit most or all of the 3D layers into a single reticle, a single simultaneous tapeout release is possible for most or all of the layers in the 3D chip.

As noted above, pervasive logic (e.g., BIST logic with the I/O layer) utilizes an integrated distributed test interface built into each layer, which allows for testing all of the layers at a single time at wafer test. This greatly reduces total test time as the multiple layers in the single reticle can all be tested simultaneously. In one embodiment, this is through the I/O 3D layer, where the centralized distributed test function resides for the stack. In this case, the 3D layers are tested as a full stack, with the same test applied to the completed stack.

An additional benefit of the present invention is the easy elimination of layers that tested poorly in previous testing. After testing, the elements in a single reticle are cut apart for the formation of a stack. Layers that fail testing are removed from the final layout of the stack. Thus, it is possible to tapeout multiple 3D layers in single tapeout, shoot them in a single reticle, test them as though they were a single chip, and effectively get partial good-like yields by keeping only the good layers.

It should be understood that at least some aspects of the present invention may alternatively be implemented in a computer-readable medium that contains a program product. Programs defining functions of the present invention can be delivered to a data storage system or a computer system via a variety of tangible signal-bearing media, which include, without limitation, non-writable storage media (e.g., CD-ROM), writable storage media (e.g., hard disk drive, read/write CD ROM, optical media), as well as non-tangible communication media, such as computer and telephone networks including Ethernet, the Internet, wireless networks, and like network systems. It should be understood, therefore, that such signal-bearing media when carrying or encoding computer readable instructions that direct method functions in the present invention, represent alternative embodiments of the present invention. Further, it is understood that the present invention may be implemented by a system having means in the form of hardware, software, or a combination of software and hardware as described herein or their equivalent.

While the present invention has been particularly shown and described with reference to a preferred embodiment, it will be understood by those skilled in the art that various changes in form and detail may be made therein without departing from the spirit and scope of the invention. Furthermore, as used in the specification and the appended claims, the term "computer" or "system" or "computer system" or "computing device" includes any data processing system including, but not limited to, personal computers, servers, workstations, network computers, main frame computers, routers, switches, Personal Digital Assistants (PDA's), telephones, and any other system capable of processing, transmitting, receiving, capturing and/or storing data. Furthermore, while the present invention has been disclosed in the context of constructing a 3D processor chip, any semiconductor based logic having multiple interactive components may utilize the same construction and reconstruction processes described herein.

What is claimed is:

1. A method of constructing a three-dimensional (3D) stacked processor chip, the method comprising:
constructing a two-dimensional (2D) planar processor chip, wherein the 2D planar processor chip is composed of multiple functional sections that functionally interact among themselves, and wherein each of the multiple functional sections has a function that differs from other functional sections from the multiple functional sections;
physically cutting the 2D planar processor chip into the multiple functional sections; and
layering and coupling the multiple functional sections to construct a 3D stacked processor chip, wherein the 3D stacked processor chip retains an original functionality of the 2D planar processor chip.

2. The method of claim 1, further comprising:
testing the 2D planar processor chip before physically cutting the 2D planar processor chip into the multiple functional sections; and
in response to all of the multiple functional sections from the 2D planar processor chip passing the testing, layering and coupling the multiple functional sections to construct the 3D stacked processor chip.

3. The method of claim 1, further comprising:
testing the 2D planar processor chip before physically cutting the 2D planar processor chip into the multiple functional sections; and
in response to only a portion of the multiple functional sections from the 2D planar processor chip passing the testing, layering and coupling the functional sections that have passed the testing from multiple 2D planar processor chips to construct the 3D stacked processor chip.

4. The method of claim 1, wherein each of the multiple functional sections are coupled to sections of a peripheral bus, and wherein layers of the 3D stacked processor chip are coupled by a layer-layer bus that functionally and physically interfaces with the peripheral bus on each layer of the 3D stacked processor chip.

5. The method of claim 4, further comprising:
testing the 3D stacked processor chip; and
in response to the 3D stacked processor chip failing the testing, replacing only the layer-layer bus in the 3D stacked processor chip.

6. The method of claim 4, wherein the layer-layer bus includes a multiplexer that controls data transmission to specific layers of the 3D stacked processor chip.

7. The method of claim 1, wherein the 3D stacked processor chip is composed of multiple layers, wherein each of the multiple layers is composed of one of the multiple functional layers that was cut out of the 2D planar processor chip, and wherein the multiple layers comprise an accelerator layer, a cache layer, a compute layer, and an Input/Output (I/O) layer.

8. The method of claim 7, wherein the accelerator layer comprises a cryptology logic for encrypting data being transmitted from the 3D stacked processor chip, a pattern matching logic for identifying types of data being received by the 3D stacked processor chip, a compression/decompression logic for compressing and decompressing data being sent from and to the 3D stacked processor chip, and an extensible markup language (XML) logic for executing XML command-based messages that are received by the 3D stacked processor chip.

9. The method of claim 7, wherein the cache layer contains only level three (L3) cache.

10. The method of claim 7, wherein the compute layer contains multiple processors.

11. The method of claim 7, wherein the I/O layer comprises pervasive logic for performing a Built In Self Test (BIST) on the 3D stacked processor chip, wherein the BIST is performed by directly accessing scan chain logic on all of the multiple layers via the layer-layer bus.

12. A three-dimensional (3D) stacked computer chip comprising:
multiple layers, wherein each of the multiple layers comprises a different functional section that was cut from a two dimensional (2D) planar computer chip, wherein the 2D planar computer chip is composed of multiple functional sections that functionally interact among themselves, and wherein each of the multiple functional sections has a function that differs from other functional sections from the multiple functional sections;
a different peripheral bus coupled to each of different functional section of different layers of the 3D stacked computer chip; and
a layer-layer bus that functionally and physically connects peripheral buses on each layer of the 3D stacked computer chip, wherein the 3D stacked computer chip retains an original functionality of the 2D planar processor chip.

13. The 3D stacked computer chip of claim 12, wherein the multiple layers comprise an accelerator layer, a cache layer, a compute layer, and an Input/Output (I/O) layer.

14. The 3D stacked computer chip of claim 13, wherein the accelerator layer comprises a cryptology logic for encrypting data being transmitted from the 3D stacked computer chip, a pattern matching logic for identifying types of data being received by the 3D stacked computer chip, a compression/decompression logic for compressing and decompressing data being sent from and to the 3D stacked computer chip, and an extensible markup language (XML) logic for executing XML command-based messages that are received by the 3D stacked computer chip.

15. The 3D stacked computer chip of claim 13, wherein the I/O layer comprises pervasive logic for performing a Built In Self Test (BIST) on the 3D stacked computer chip, wherein the BIST is performed by directly accessing scan chain logic on all of the multiple layers via the layer-layer bus.

16. The 3D stacked computer chip of claim 13, wherein the layer-layer bus includes a multiplexer that controls data transmission to specific layers of the 3D stacked computer chip.

17. A computer-readable storage medium on which is encoded a computer program, wherein the computer program comprises computer executable instructions that, when executed on a processor:
test a two-dimensional (2D) planar processor chip, wherein the 2D planar processor chip is composed of multiple functional sections that functionally interact among themselves, and wherein each of the multiple functional sections has a function that differs from other functional sections from the multiple functional sections; and
test a three-dimensional (3D) stacked processor chip that is constructed from said multiple functional sections that have been cut out of the 2D planar processor chip, wherein the 3D stacked processor chip retains an original functionality of the 2D planar processor chip.

18. The computer-readable storage medium of claim 17, wherein the computer executable instructions are further configured for:
testing an accelerator layer in the 3D stacked processor chip, wherein the accelerator layer comprises a cryptology logic for encrypting data being transmitted from the 3D stacked processor chip, a pattern matching logic for identifying types of data being received by the 3D stacked processor chip, a compression/decompression logic for compressing and decompressing data being sent from and to the 3D stacked processor chip, and an extensible markup language (XML) logic for executing XML command-based messages that are received by the 3D stacked processor chip.

19. The computer-readable storage medium of claim 17, wherein the executable instructions are further configured for:
utilizing an Input/Output (I/O) layer in the 3D stacked processor chip to perform a Built In Self Test (BIST) on the 3D stacked processor chip, wherein the BIST is performed by directly accessing scan chain logic in all layers of the 3D stacked processor chip via a layer-layer bus.

20. The computer-readable storage medium of claim 19, wherein the layer-layer bus comprises multiplexer logic for controlling data transmission between the layers of the 3D stacked processor chip.

* * * * *